United States Patent
Seuring et al.

(10) Patent No.: US 8,307,249 B2
(45) Date of Patent: Nov. 6, 2012

(54) AT-SPEED BITMAPPING IN A MEMORY BUILT-IN SELF-TEST BY LOCKING AN N-TH FAILURE

(75) Inventors: Markus Seuring, Stuttgart (DE); Kay Hesse, Dresden (DE); Kai Eichhorn, Dresden (DE)

(73) Assignee: Globalfoundries, Inc., Grand Cayman (KY)

( * ) Notice: Subject to any disclaimer, the term of this patent is extended or adjusted under 35 U.S.C. 154(b) by 367 days.

(21) Appl. No.: 12/709,565

(22) Filed: Feb. 22, 2010

(65) Prior Publication Data

US 2010/0223511 A1 Sep. 2, 2010

(30) Foreign Application Priority Data

Feb. 27, 2009 (DE) .................... 10 2009 010 881

(51) Int. Cl.
*G11C 29/00* (2006.01)
(52) U.S. Cl. ........ 714/723; 714/718; 714/719; 714/738; 714/742; 714/733; 714/734; 714/6.1; 714/6.11; 714/25; 714/30; 714/42; 714/739; 714/736; 365/201
(58) Field of Classification Search ................ None
See application file for complete search history.

(56) References Cited

U.S. PATENT DOCUMENTS

| 7,603,595 | B2 * | 10/2009 | Sasaki | 714/718 |
|---|---|---|---|---|
| 8,032,803 | B2 * | 10/2011 | Anzou et al. | 714/719 |
| 2007/0150777 | A1 | 6/2007 | Sasaki | 714/718 |
| 2008/0082883 | A1 * | 4/2008 | Gorman et al. | 714/733 |
| 2008/0222464 | A1 * | 9/2008 | Gorman et al. | 714/718 |
| 2009/0172483 | A1 * | 7/2009 | Anzou et al. | 714/723 |
| 2009/0217112 | A1 * | 8/2009 | Eckelman et al. | 714/723 |

OTHER PUBLICATIONS

Translation of Official Communication from German Patent Office for German Patent Application No. 10 2009 010 881.5 dated Feb. 19, 2010.

* cited by examiner

*Primary Examiner* — John Trimmings
(74) *Attorney, Agent, or Firm* — Williams, Morgan & Amerson (57) ABSTRACT

In a sophisticated semiconductor device including a large memory portion, a built-in self-test circuitry comprises a failure capturing logic that allows the capturing of a bitmap at a given instant in time without being limited to specific operating conditions in view of interfacing with external test equipment. Thus, although pipeline processing may be required due to the high speed operation during the self-test, reliable capturing of the bitmap may be achieved while maintaining high fault coverage of the test algorithm under consideration.

23 Claims, 3 Drawing Sheets

AT-SPEED BITMAPPING IN A MEMORY BUILT-IN SELF-TEST BY LOCKING AN N-TH FAILURE

BACKGROUND OF THE INVENTION

1. Field of the Invention

The present disclosure generally relates to techniques for testing semiconductor devices, and, more particularly, to techniques for testing integrated circuits that include logic circuitry portions and embedded memory portions with memory built-in self-test logics connected thereto.

2. Description of the Related Art

In manufacturing semiconductor devices including relatively complex circuitry, the testing of the device may represent a part of the manufacturing process, which is frequently underestimated in terms of cost and effort required to obtain reliable data with respect to proper functionality and reliability of the device. One reason in failing to meet performance specifications of the integrated circuit may reside in design errors that may be identified and remedied by circuit verification on the basis of software simulation and/or prototype testing prior to mass production of the integrated circuits under consideration. An improper functionality of the integrated circuit may further be caused by the manufacturing process itself when the completed circuitry does not correspond to the verified circuit design owing to process fluctuation in one or more of the very large number of process steps. Although measurement and test procedures are incorporated at many points in the manufacturing process, it is nevertheless extremely important to ascertain the correct functioning of the final semiconductor device, since, according to a common rule of thumb, the costs caused by defective chips increase with each assembly phase by approximately one order of magnitude. For example, the costs caused by a defective circuit board including a faulty chip are typically significantly higher than identifying a defective chip prior to shipping and assembling the circuit board. The same holds true for a system, when a failure thereof is caused by one or more defective circuit boards, as a downtime of an industrial system may result in averaged costs of approximately several hundred dollars per minute compared to a price of a few dollars for an integrated circuit chip having caused the defect.

Hence, there is a vital interest in developing test procedures to identify as many defects as possible in completed integrated circuits while not unduly increasing the total manufacturing costs. In particular, with the demand for more features and lower costs of circuits, there is a tendency to integrate a plurality of different circuit portions into a single chip to provide a complete system on a chip (SOC). A semiconductor device comprising various functional blocks may typically include, in addition to one or more logic blocks, one or more embedded memory portions, such as are used as on-chip cache for CPUs or as buffers for data packets that are transferred between different clock domains.

As discussed above, economic constraints force semiconductor manufacturers to not only minimize the defect level of the total manufacturing process, but also to provide, in combination with a reduced defect level, a high fault coverage so as to reduce the delivery of defective chips at reasonable cost for appropriate test procedures and techniques. For moderately complex integrated circuits, it has become standard practice to develop the basic design of the circuit while taking into consideration a plurality of constraints posed by effective test procedures. Moreover, typically, additional hardware resources are provided in the chip that may enable the identification of faulty circuit components for a broad class of operating conditions, wherein the additional hardware resources in combination with design specifics of the basic circuit and sophisticated test procedures and test patterns substantially determine the fault coverage of the test procedure.

In many circuit designs, the functional logic portion is tested by so-called scan chains, which represent a chain of flip-flops connected to a specific area of the functional logic in such a way that the functional logic or a specific area thereof may be initialized with a desired state that has previously been entered into the scan chain. Moreover, upon providing one or more clock signals to the functional logic, the state thereof, that is the state of each logic gate connected to a dedicated flip-flop of the scan chain, may then be stored in the scan chain and may be shifted out by supplying respective shift clock signals to the scan chain. Depending on the bit pattern or input vector entered into the scan chain for initializing the functional logic, corresponding faulty logic gates may be identified. However, the fault coverage, i.e., the potential for identifying any error within the functional logic, significantly depends on the design, selection and number of appropriate scan chains and suitable input vectors. In principle, such scan test techniques may also be modified so as to include the testing of memory portions, wherein, however, only for small memories, appropriate scan test patterns, i.e., the number and size of appropriate input vectors, may exhibit a size that allows the testing of memory portions within acceptable time intervals.

Figure 1A:
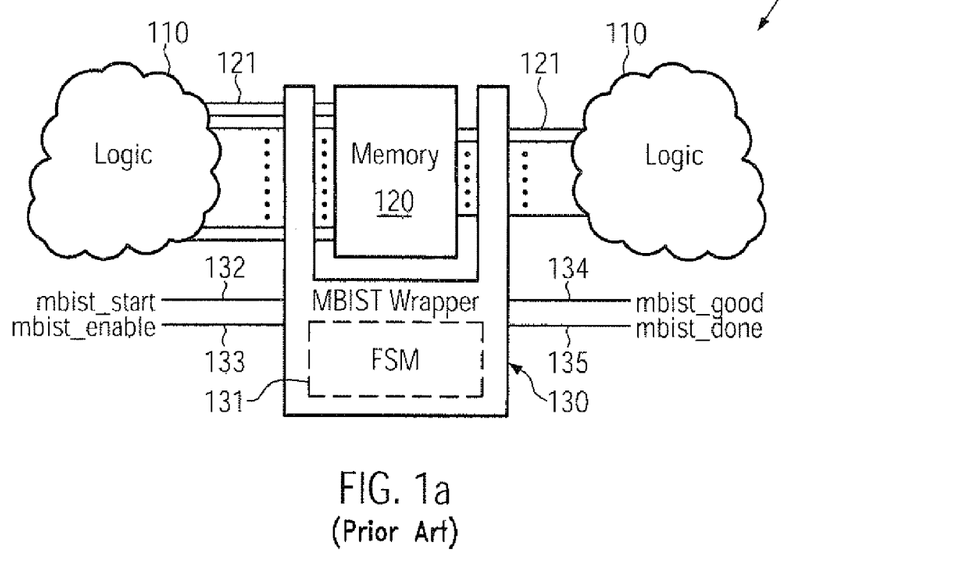
FIG. 1*a* schematically illustrates a circuit diagram of a semiconductor device including a conventional built-in memory test circuit.
Figure 1B:
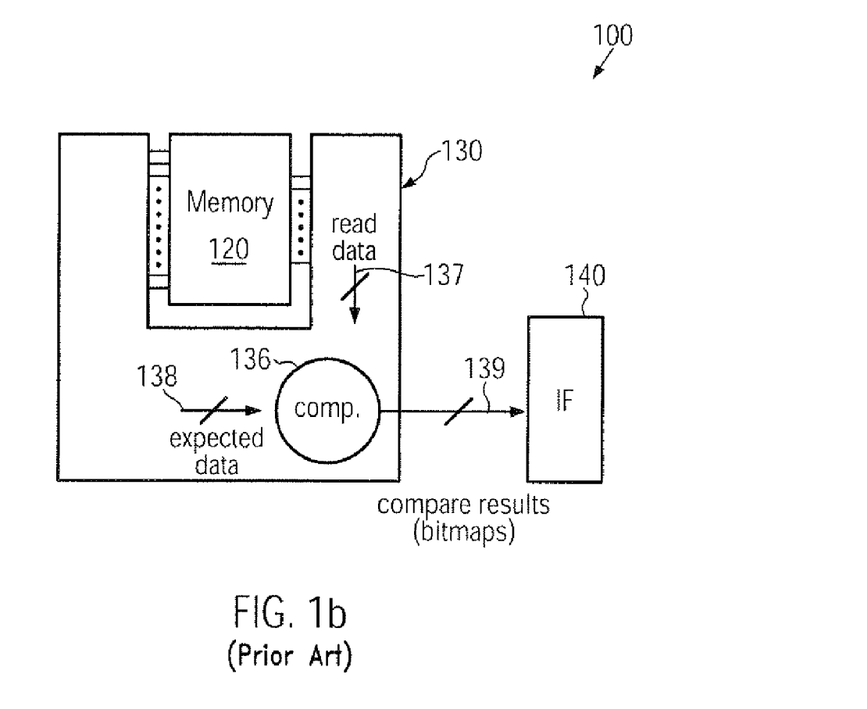
FIG. 1*b* schematically illustrates the semiconductor device including an interface for transferring refined failure data to the periphery for high speed and high bit width memory portions, thereby requiring a limitation of the bandwidth of the interface, according to conventional strategies.

For this reason, frequently, a so-called memory built-in self-test (MBIST) logic is provided as an additional hardware resource within a chip to implement a memory test procedure requiring fewer clock cycles and supporting the testing of important extended fault models that are specific to memories. With reference to FIGS. 1a-1b, the configuration and the test procedures for a representative conventional semiconductor device including functional logic and a memory portion are described in more detail so as to more clearly illustrate the problems involved.

FIG. 1a schematically shows a circuit diagram of a semiconductor device 100 including a functional logic circuitry 110, which may be connected to a memory portion 120 via write lines, read lines and control lines that are commonly referred to as lines 121. The device 100 further comprises an MBIST logic 130 including, for instance, a finite state machine 131 for implementing a desired algorithm for testing the memory portion 120. The MBIST logic 130 further comprises all components required for disconnecting the memory portion 120 from the functional logic 110 so as to enable the operation of the memory portion 120 fully under control of the MBIST logic 130 when operating the logic 130 for the memory test.

On the other hand, when disabled, the MBIST logic 130 is "transparent" for the lines 121 so as to allow proper operation of the logic circuitry 110 in combination with the memory portion 120. The MBIST logic 130 comprises a first control input 132, which is also referred to as MBIST-start, and a second control input 133, also indicated in the drawing as MBIST-enable. Moreover, a first output 134, also referred to in the drawing as MBIST-good, and a second output 135, also indicated as MBIST-done, are provided in the MBIST logic 130. It should be noted that, for convenience, any additional inputs or outputs of the logic 130, such as clock inputs, reset inputs and other control lines, are not shown.

When operating the device 100 in a memory test mode, the MBIST logic 130 may be enabled by providing a corresponding signal at the input 133 (MBIST-enable) to disconnect the memory portion 120 from the surrounding logic circuitry

110. By supplying a corresponding signal at the input 132 (MBIST-start), the circuit portion 130 is started to generate address values and to write data into the memory portion 120. The circuit 130 may also include a comparator, which may be configured to check if the data written into the memory 120 may be correctly read back from the memory, and which may provide a corresponding value at the output 134 (MBIST-good). For instance, the value of the output 134 may show logic "0" as long as no error occurs in writing data into the memory 120 and reading back the data, while the output 134 may be set to a logic "1" once a mismatch between the actually read data and the expected data is detected. After the test of the memory 120 is completed, a corresponding signal may be presented at the output 135 (MBIST-done), for instance, the output 135 may be switched from logic "0" to logic "1" if the test is completed.

Consequently, on the basis of an appropriately designed test algorithm, the memory portion 120 may be tested with respect to any relevant failure types, such as "stuck-at," "stuck-open," coupling of memory cells, etc., wherein the built-in test portion 130 may be operated at regular operating speed of the semiconductor device 100. In some cases, the self-test may even be performed on the basis of a clock frequency that may be higher than that of the device 100 at standard operating conditions. It should be appreciated, however, that, at very high frequencies, as may typically be used in modern circuit designs, the failure detection itself, i.e., the comparison between the results of the read operations and the corresponding expected values, i.e., the values previously written into the memory, may take several clock cycles in the internal pipelines of the test circuitry 130. That is, due to the high operating speeds, several stages of processing the relevant signals, such as the bit vectors obtained as read results, providing the comparison result and the like, have to be performed in several stages in order to ensure a reliable signal processing so as to avoid undue errors in obtaining the global memory test results. Thus, upon completing the memory self-test on the basis of an appropriate algorithm, a global assessment may be obtained on line 134, which may thus represent a simple fail/no fail statement with respect to the functional behavior of the memory portion 120. In some cases, additional information may be provided by the test circuitry 130, for instance in the form of a memory address of the first failure detected when performing the test algorithm in the test circuitry 130. Although the corresponding memory test results may be sufficient for qualifying products prior to shipping the same, additional information may be highly desirable in view of enhancing yield engineering, failure diagnosis and design improvements. For these tasks, a sampling of all failing addresses and bits may be necessary in order to construct a so-called bitmap to determine whether the defects detected follow a specific typographical pattern. For this purpose, the failure data, that is typically the comparator results between expected values and any values read out from the memory portion 120, is transferred to an external test equipment in order to establish a corresponding bitmap and perform additional fault analysis. Hence, for every read operation on the memory under test, the comparator results are conveyed to the chip's periphery on the basis of an appropriate interface.

FIG. 1*b* schematically illustrates a portion of the semiconductor device 100 in which the test circuitry 130 comprises a comparator unit 136 that received input data, for instance in the form of bit vectors 137, 138, which may represent the results of a read operation performed on the plurality of memory cells and the corresponding expected data, which may represent the bit values for a portion of the memory 120 in a proper functional state when accessed by the read operations. Similarly, the comparator 136 may output a result bit vector 139, which may thus include the comparison results for each of the read operations of the memory cells accessed during one read cycle performed on the memory 120. The corresponding bit vector 139 may be transferred to an interface 140, which may allow access of the semiconductor device 100 by an external test equipment in which a plurality of result vectors 139 may be stored and may be used as a bitmap for evaluating the operational behavior and status of the memory portion 120. In sophisticated semiconductor devices, the memory portion 120 may be operated with clock frequencies of 1 GHz and significantly higher, while a bit width during a corresponding memory access may involve several hundred bits. Consequently, the bandwidth provided by the data path including the interface 140 may not support the operation of the circuitry 130 at the desired high speed when the plurality of continuous read operations are to be performed so that a corresponding adaptation of the bandwidth defined by the interface 140 may have to be guaranteed so as to avoid data corruption. However, a corresponding limitation of data transfer from the internal test circuitry 130 to an external test equipment may be associated with a reduced reliability of the test results since the detection of any failure that may only manifest itself at full speed, such as weak coupling of memory cells, delay dependant faults and the like, are no longer detectable or are detectable with a significantly reduced degree of fault coverage only.

In view of the situation described above, the present disclosure relates to semiconductor devices and methods of operating the same in which failure results of a memory may be obtained on the basis of a device internal test circuitry while avoiding, or at least reducing, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides a semiconductor device and techniques for operating the same in which refined failure data may be obtained during a memory self-test while significantly reducing any restrictions with respect to bandwidth adaptation, as may typically be required in conventional techniques. To this end, the failure results may be captured at a given moment in time and may be stored in device internal registers so that a corresponding "bitmap" may be available and accessible at any time, for instance after completing a corresponding self-test algorithm, thereby providing information about the memory status at the given moment in time without being restricted to specific bandwidth adaptation and the like. In some illustrative aspects disclosed herein, a detailed failure data may be obtained for any given memory failure that may be detected on the basis of a specific test algorithm so that, for each failure, an associated bitmap or result vector may be captured and stored within the built-in test circuit, which may thus be able to detect speed critical memory failures and appropriately preserve the corresponding bitmap associated with any such memory failure. Hence, after completing a specific cycle of the test algorithm, a bitmap associated with a specified memory failure, such as the n$^{th}$ failure, may be read out from the semiconductor device in any appropriate manner, for instance by serial shifting out the result vector on the basis of a clock frequency adapted to the capabilities of a corresponding interface for connecting the device internal test circuit to external test equipment. As a consequence, large memories associated with a wide bit width and operated at high frequencies, such as 1 GHz and higher, may be tested at full speed by providing an appropriately designed pipeline in the device internal test equipment, which may capture and store the desired failure results at any given moment in time, i.e., at a corresponding clock cycle corresponding to the occurrence of an associated memory failure.

One illustrative semiconductor device disclosed herein comprises a memory portion and a memory built-in self-test (MBIST) circuitry connected to the memory portion. The MBIST circuitry is configured to perform a memory self-test by reading out the memory portion and comparing read results with reference data to provide compare results to identify a plurality of failures. The MBIST circuitry comprises a failure capturing logic that is configured to capture and store a failure bitmap associated with a predetermined failure of the plurality of memory failures.

One illustrative method disclosed herein relates to performing a memory self-test of a memory portion of a semiconductor device. The method comprises selecting a predefined memory failure of a sequence of memory failures occurring when performing a specified self-test algorithm. The method further comprises performing the specified self-test algorithm by operating a memory built-in self-test circuitry (MBIST) of the semiconductor device to perform a plurality of read operations to obtain an associate read result bit vector from the memory portion and to compare each of the plurality of read results bit vectors with a corresponding reference bit vector to obtain a compare result bit vector for each of the read operations. Additionally, the method comprises storing a compare result bit vector associated with the predefined memory failure in the MBIST circuitry of the semiconductor device.

A still further illustrative method disclosed herein relates to performing a memory self-test of a memory portion of a semiconductor device. The method comprises performing a test algorithm by a device internal test circuitry, wherein the test algorithm provides a plurality of local subsets of failure results at a first clock cycle. The test algorithm further provides a global failure result at a second clock cycle that is subsequent to the first clock cycle. The global failure result is based on the local subsets of failure results and the plurality of local subsets of failure results include at least one failure result indicating a memory failure. Additionally, the method comprises locking the at least one failure result at the first clock cycle and globally locking the plurality of local subsets of failure results at the second clock cycle. Finally, the method comprises reading out the plurality of local subsets of failure results after completing the test algorithm.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques for operating the same in which detailed failure data may be captured at a given instant of time, i.e., at the occurrence of a specified memory failure, while, on the other hand, the high speed operation of the memory to be tested and the corresponding width of the memory portion may require pipelined processing of the test signals. For this purpose, the built-in test circuitry may comprise an appropriately configured failure capturing logic, which may efficiently "lock" failure results, which may contribute to a specific global memory failure, while at the same time also providing the associated status of the memory without interference of other stages of processing the failure data, i.e., of other pipeline stages required for processing the failure data at a desired high speed of a wide memory portion. In one illustrative embodiment disclosed herein, a two-stage pipeline may be provided to identify a "global" memory failure, i.e., a failure indicating that an error may have occurred for a corresponding plurality of read operations performed at a given clock cycle, while also the corresponding status of the memory may be captured at the clock cycle at one or more failures which may have occurred in any of the read data. To this end, a plurality of "local" lock mechanisms may be provided in which a subset of the failure data may locally be locked upon occurrence of one failure bit. Additionally, a global locking of all subsets of failure data may be accomplished upon detecting a local failure event, wherein any additional local failure events may be "ignored," which may occur in the time period between the first local locking of failure data and the associated global locking of all local subsets of failure data. Hence, although processing of the large number of failure data may be divided into a plurality of local subsets, which may be processed in two or more pipeline stages, the failure data may nevertheless be generated so as to correspond to the memory status of that clock cycle that causes the memory failure. Consequently, the result vector or bitmap associated with a specific memory failure may be read out at any appropriate point in time, for instance after completing a specific cycle of a test algorithm, without any restrictions in terms of bandwidth of a corresponding interface connecting to external test equipment. For example, upon capturing the bitmap at a given point in time, the entire test algorithm may be performed at full speed, thereby providing enhanced coverage of any speed dependent memory failures, which may otherwise remain undetected in conventional strategies in which certain interruptions in the test algorithm may be introduced so as to allow the reading out of the bitmap based on a significantly reduced bandwidth of a corresponding interface, as previously explained. Furthermore, detection of dynamic memory faults may be accomplished without requiring any mirror memories in the semiconductor device under consideration, which may only rarely be available.

Figure 2A:
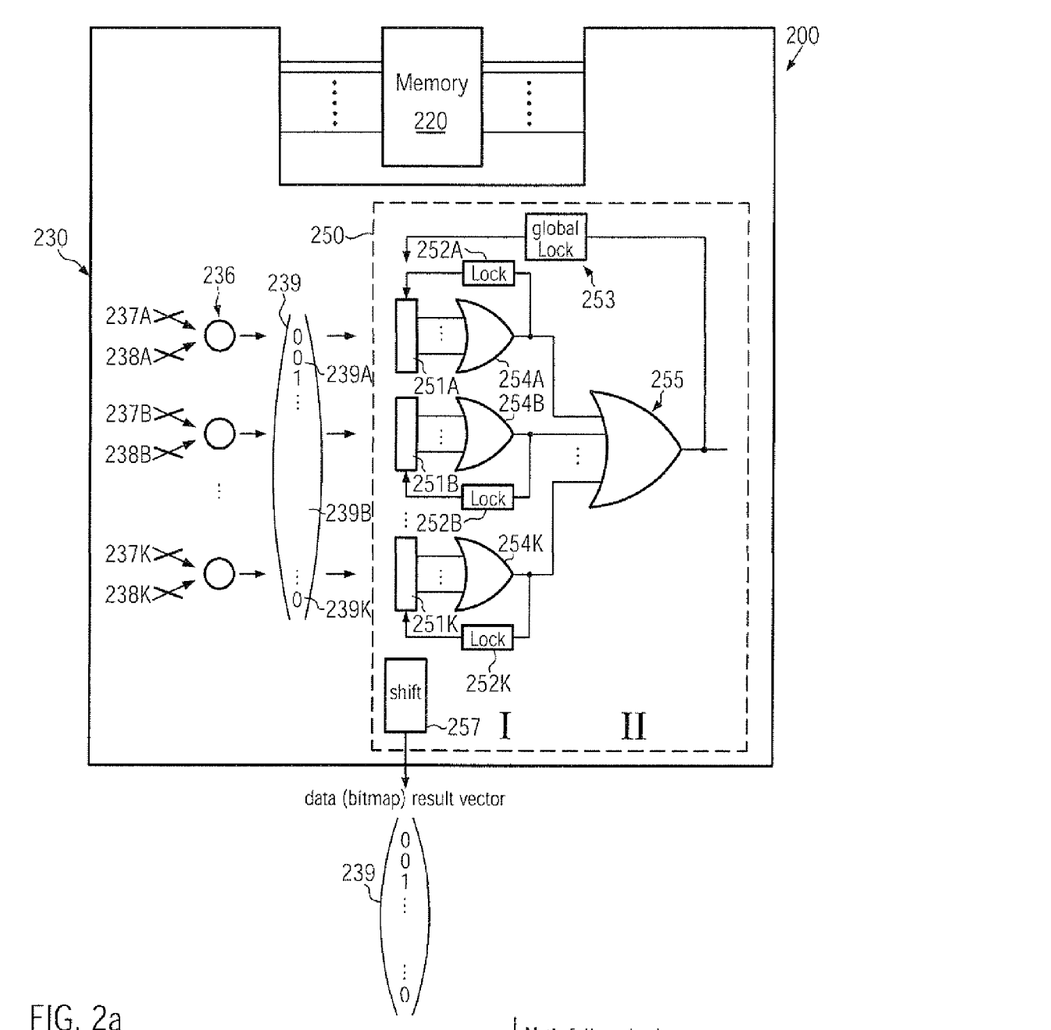
FIG. 2*a* schematically illustrates a circuit diagram of a portion of a semiconductor device including a memory and a built-in self-test circuit, which may comprise memory failure capturing circuit for capturing and storing a corresponding bitmap for one of a plurality of memory failures, according to illustrative embodiments.
Figure 2B:
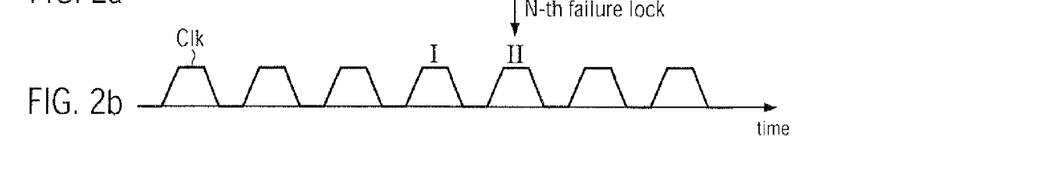
FIG. 2*b* schematically illustrates a time diagram indicating a sequence of clock signals wherein the capturing of a bitmap associated with n$^{th}$ failure may be effectively accomplished in a single clock cycle, according to illustrative embodiments.
Figure 2C:
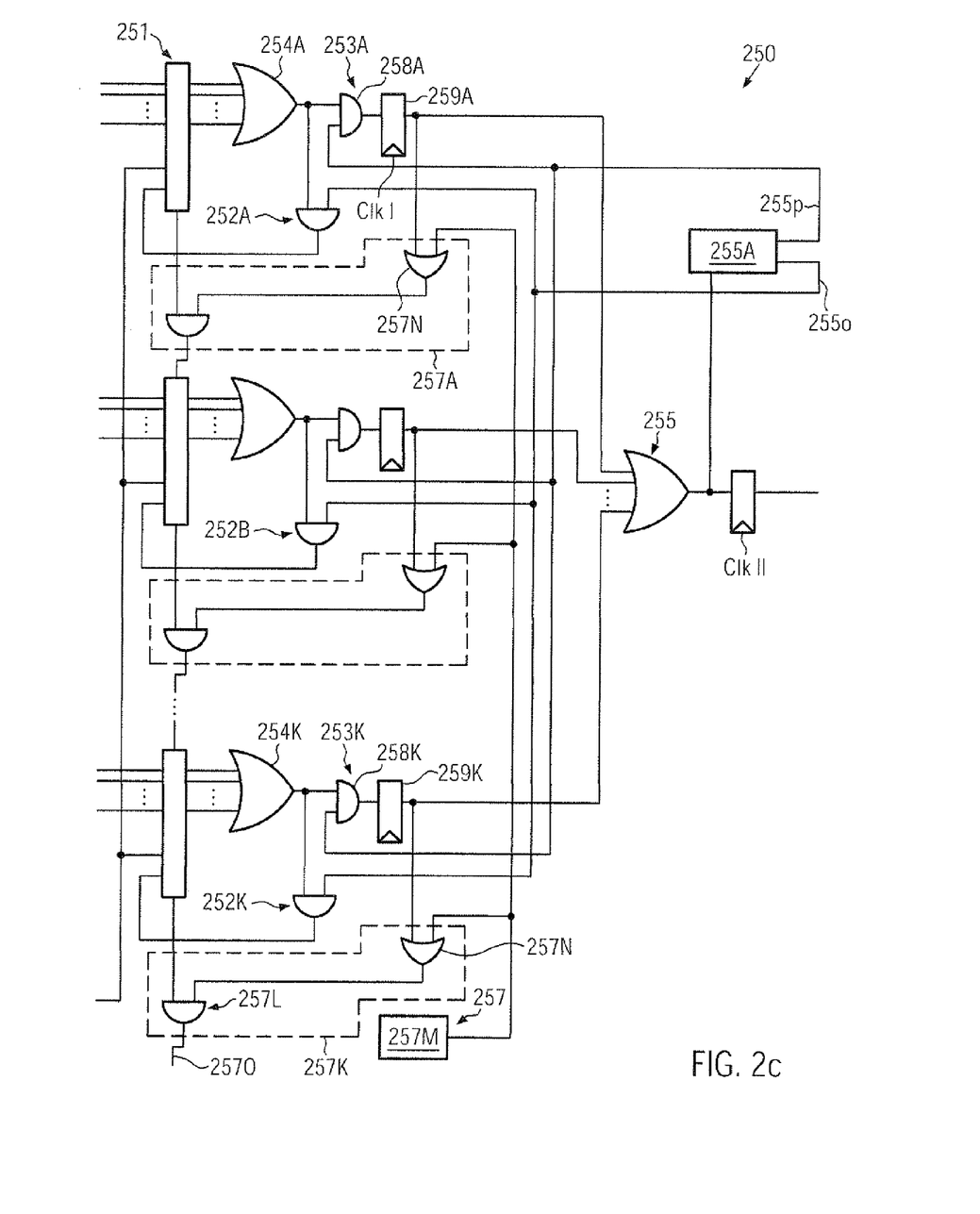
FIG. 2*c* schematically illustrates a circuit diagram illustrating a more detailed representation of the failure capturing logic, according to further illustrative embodiments.

With reference to FIGS. 2a-2c, further illustrative embodiments will now be described in more detail, wherein reference may also be made to FIGS. 1a-1b, if appropriate.

FIG. 2a schematically illustrates a semiconductor device 200, which may represent a device including any type of electronic circuitry, micromechanical features and the like, depending on the overall type of semiconductor device under consideration. The device 200 may comprise at least one memory 220, which may be operatively coupled to other circuit portions (not shown), such as any digital circuitry for controlling access to the memory 220 and also providing other functions and the like. For instance, the device 200 may comprise analog and digital circuit portions, such as a CPU core, a microcontroller core and the like, which may be operated in combination with the memory 220. In some illustrative embodiments, the memory 220 may represent a large memory area in which read and write operations may result in access to a moderately high number of bits, such as 200 bits and higher. It should be appreciated that the memory 220 may be provided by any appropriate technology, such as RAM (random access memory) and the like, wherein, in sophisticated embodiments, a memory access may be performed on the basis of moderately high clock frequencies, such as 1 GHz and higher.

The device 200 may further comprise a built-in self-test circuitry 230, also referred to as MBIST circuitry, which may be considered as a device internal circuit portion in the sense that circuit elements of circuit portion 230 may be formed on and above the same substrate material as the memory 220. The self-test circuitry 230 may comprise any components for connecting to the memory 220, as is also described with reference to the semiconductor device 100, thereby providing I/O resources for performing read and write operations on the memory 220 during a self-test phase, while, on the other hand, being transparent during normal operation of the semiconductor device 200. The circuitry 230 may comprise a failure capturing logic 250, which may be configured to capture and store failure data associated with a given moment in time, i.e., associated with a respective one of a plurality of memory failures that may be detected upon performing a specific test algorithm in the circuitry 230. To this end, the failure capturing logic 250 may be configured to receive respective failure data 239, which may, in one illustrative embodiment, be understood as a bit vector including a plurality of bits indicating the failure status of the memory 220 at a certain phase of the test algorithm. Thus, the vector 239 may also be considered as a bitmap including information on the status of the memory 220 at a certain point in time and with respect to conditions given by the test algorithm under consideration. For example, the vector 239 may comprise a plurality of logic 0 indicating a correct functional behavior of respective memory cells 220, while the presence of a logic 1 may indicate a memory failure associated with a corresponding memory address, which may be obtained under the specific operational conditions given by the test algorithm under consideration. As previously explained, certain types of memory failures may be associated with certain operational conditions, such as performing read and write operations at high clock frequencies, for instance performing a plurality of read operations back-to-back, that is, a sequence of read operations may be performed in a continuous manner, which may result in a specific type of memory failure which may be difficult to be detected on the basis of test techniques in which the operation of the memory 220 may have to be adapted to the bandwidth resources of a corresponding interface for conveying the failure data to an external test equipment in order to obtain the desired bitmap. As also discussed above, the bitmap or vector 239 may be divided into a plurality of local failure results, for instance as indicated as 239A . . . 239K, so as to obtain appropriate data segments, the handling of which may be compatible with the speed requirements of the test algorithm under consideration. Thus, the plurality of segments 239A . . . 239K may be considered as a plurality of subsets of failure data, each of which may have an appropriate width that is compatible with the timing and hardware requirements for processing the failure data 239 within the capturing logic 250. In the embodiment shown, the failure data 239 may be obtained on the basis of a plurality of comparator units 236, in each of which respective input data 237A . . . 237K may be compared with a corresponding set of input data 238A . . . 238K, wherein the data 237A may represent the results of a read operation performed on the memory 220 while the associated data 238A may represent corresponding "reference" data or expected data, which are to be considered as data that are to be expected to be read out from the memory portion upon a correct functional behavior of the respective memory cells. As previously indicated, due to moderately wide width of the memory 220, each of the subsets 237A ... 238K may be considered as a bit input vector having an appropriate width that is compatible with a hardware configuration and the signal processing constraints imposed by moderately high clock frequency, as discussed above.

The failure capturing logic 250 may be appropriately configured to receive the input data 239, i.e., the plurality of sub vectors 239A ... 239K, and may store the vector 239 for a desired point in time, i.e., upon occurrence of memory failure of the memory 220. In the embodiment shown, a corresponding memory failure may be represented by at least one logic "1" in the vector 239. It should be appreciated, however, that, in other cases, the failure data 239 may indicate a memory failure in the form of a logic "0" and may represent a proper memory status in the form of a logic "1." Consequently, upon occurrence of a logic "1" in the data 239, the logic 250 may determine whether or not this point in time is the desired point in time, i.e., the desired memory failure for which the corresponding bitmap or vector 239 is to be stored and to be made accessible for further analysis without negatively affecting the overall test algorithm. Furthermore, the logic 250 may appropriately store the vector 239 without affecting the further test algorithm and may further ensure that any subsequent occurrence of memory failure may not be represented in the vector 239, since, in this case, the bitmap associated with the preceding memory failure, for which an "overview" of the associated memory status is desired, would be at least partially "overwritten" by failure events actually occurring after the point in time of interest. For this purpose, the logic 250 may comprise respective compare registers 251A ... 251K, also commonly referred to as registers 251, which may be appropriately controlled so as to detect a bit failure in the data 239 and appropriately store the contents of the vector 239 or at least guarantee that the status of the vector 239 may be read out at any later phase, for instance after the completion of the entire run of the corresponding test algorithm. Hence, although a division into several subsets of input data 239A ... 239K may be required and also irrespective of the fact that the signal processing for identifying a memory failure state and storing a bitmap 239 may have to be performed in a pipelined manner due to high clock frequency used in operating the memory 220 in combination with the test circuitry 230, the contents of the bitmap 239 may be available for further analysis at a later stage. In the embodiment shown, the logic 250 may comprise, as a first pipeline stage, indicated as I, a plurality of local lock mechanisms 252A ... 252K, also commonly referred to as mechanisms 252, each of which may be configured to lock the respective compare register 251 upon occurrence of memory failure in the embodiment shown upon occurrence of a logic 1 bit value in the associated subset 239A ... 239K. For example, an OR gate 254A ... 254K may be connected to a respective one of the registers 251 so that, upon occurrence of a logic 1 at the input of the OR gate 254A, the associated lock mechanism 252A may be triggered so as to disable the compare register 251A, thereby "freezing" the contents thereof and thus making the register 251A "insensitive" for logic 1 that may occur in a subsequent clock cycle.

Furthermore, the logic 250 may comprise a second pipeline stage, indicated as II, which may comprise a further OR gate 255 receiving the output signals of each of the local OR gates 254A ... 254K. Consequently, the OR gate 255 may indicate the occurrence of the memory failure at a position within the input vector 239, which may thus provide the corresponding functional/non-functional statement when testing the memory 220, according to many conventional strategies, as previously explained with reference to FIG. 1a. The OR gate 255, which may thus indicate a "global" memory failure, may be connected to a global lock mechanism 253, which may in turn be connected to each of the compare registers 251, thereby locking each of the registers 251 upon occurrence of a global memory failure indicated by the gate 255. In some illustrative embodiments, the global lock mechanism 253 may further be configured to perform the global lock event for a specified global memory failure only. That is, the global lock mechanism 253 may determine whether or not the global failure indicated by the gate 255 may represent a preselected one of a sequence of global memory failures that may be generated upon performing the test algorithm in the circuitry 230. If a global failure indicated by the gate 255 corresponds to the preselected failure, for instance the $n^{th}$ memory failure for a given test algorithm, the global lock event may be activated so as to avoid activation of one or more of the further local lock mechanisms 252A ... 252K. Consequently, upon occurrence of the $n^{th}$ global failure, the contents of the compare registers 251 may be stored in the second stage of the pipeline defined by the gates 252 and 255, while respective local lock mechanisms may be triggered at the first stage of the pipeline processing in the logic 250. In some illustrative embodiments, the logic 250 may further be configured to avoid the triggering of one or more of the local lock mechanisms 252A ... 252K at the second pipeline stage II during which a different input vector may be supplied to the compare registers 251 and which may result in overriding the contents of those compare registers 251, which have not been locked by the local mechanisms 252A ... 252K since the respective previous sub vectors 239A ... 239K may not have included a memory failure. In this manner, any additional memory failures occurring after the first pipeline stage I may be "ignored" so that a respective bitmap or vector 239, or an image thereof, may be read out, for instance after completing a test algorithm, thereby providing a memory status corresponding to the status at the first pipeline stage. In some illustrative embodiments, for this purpose, compare registers 251 that are not locally locked may be appropriately indicated so that, for instance, during shifting out the register contents, any additional memory failures occurring at the second pipeline stage may be ignored, for instance by inverting corresponding bit values, as will be explained later on in more detail. During operation of the device 200, an appropriate test algorithm may be performed on the basis of a desired operating speed, which may be at approximately 1 GHz and higher in sophisticated applications, and a corresponding sequence of read operations may be performed to obtain the plurality of read results 237A ... 237K, which may be compared with reference data 238A ... 238K by means of the comparator unit 236, thereby generating the comparator results 239, which may thus represent the bitmap, as this data may reflect memory status for each read operation of a corresponding memory cell. At a given instant of time, therefore, data 239 may be entered into the registers 251 and may thus be available at the OR gate 254A ... 254K in order to trigger one or more local lock mechanisms 252, depending on whether a failure state is indicated by the associated input data 239A ... 239K, in the present example logic 1.

FIG. 2b schematically illustrates a time diagram in which qualitatively a portion of the clock signal Clk is illustrated. Thus, at a clock signal cycle indicated as I, the triggering of respective local lock mechanisms may be initiated when a corresponding local failure bit is present in the associated sub vectors 239A ... 239K. In the subsequent clock cycle, indicated as II, the output signals of the local OR gates 254A ... 254K may be processed in the global OR gate 255, thereby initiating the global locking of the compare registers 251 when, as previously explained, the bit map 239 corresponds to the preselected memory failure, for instance the $n^{th}$ memory failure, as indicated in FIG. 2b. As previously discussed, in order to avoid an "overriding" of registers 251 that are not locally locked at the clock cycle I during the clock cycle II, the locally non-locked registers 251 may be appropriately indicated so as to ignore respective failure data written into the registers during the clock cycle II by restoring the state of the corresponding compare registers 251 to reflect the state thereof at the clock cycle I. Thereafter, upon occurrence of any further memory failures during the further memory self-test, the registers 251 are insensitive for being written to, thereby enabling the reading out of the bitmap 239 at a later stage, which may be accomplished by a serial shift logic 257, thereby allowing access to the vector 239 by external test equipment and the like, while, on the other hand, a self-test may be performed on the basis of any desired clock frequency so as to detect speed dependent memory faults, as previously explained.

FIG. 2c schematically illustrates the failure capture logic 250 according to further illustrative embodiments. As illustrated, a counter 255A may be connected to the output of the OR gate 255 and may be used as a component for identifying a desired point in time for which a bitmap is to be provided. In the embodiment shown, the counter 255A, which may be considered as a fail counter, is connected with a first output 255o to the corresponding local lock mechanisms 252A ... 252K. The mechanisms 252A ... 252K may be implemented in the form of an AND gate with one input connected to receive the output 255o of the counter 255A and with a further input connected to the output of the local OR gate 254A ... 254K. Thus, if a bitmap for a memory failure n may be desired, the counter 255A may be set to provide an asserted signal at the output 255o upon a count number of n−1. That is, after the n−1 error has been indicated by the gate 255, the output 255o is asserted, thereby "arming" the AND gates 252A ... 252K so that, upon occurrence of an asserted output of the corresponding local OR gates 254A, the output of the AND gates 252A may be asserted, thereby initiating the local locking of the appropriate compare register 251. That is, after asserting the output 255o, the local lock mechanisms 252A ... 252K are sensitive for the occurrence of a logic 1 at the gate 254A, which may then correspond to the $n^{th}$ memory failure when the local mechanisms 252A ... 252K are armed after the occurrence of the (n−1)th failure. Furthermore, the counter 255A may have a second output 255p which may provide an asserted signal for a counter value of less than n, which may therefore be de-asserted when the output of the OR gate 255 indicates the occurrence of the $n^{th}$ memory failure. As illustrated, the output signal 255p may be supplied to corresponding local AND gates 258A ... 258K which may also receive as a further input signal the output of the local OR gate 254A ... 254K. Consequently, the AND gate 258A ... 258K may provide a logic high upon receiving an asserted output signal from the OR gate 254A and as long as the counter value is less than n. Consequently, when a memory failure is indicated by one of the local OR gates 254A ... 254K, logic highs entered into a corresponding local register 259A ... 259K at the clock cycle I, thereby indicating those local compare registers 251 which are locally locked at the point of time of interest, i.e., the clock cycle I, while any other local compare registers may be indicated as registers not including a local memory failure and as registers the contents of which has to be "ignored" upon shifting out the bitmap. That is, since the signal 255p may be re-asserted and the counter 255A reaches the count value n, corresponding local registers 259A ... 259K may remain at logic low, even if the associated output of the local OR gates 254A ... 254K may provide a logic high due to the occurrence of a memory failure at a clock cycle II, since, due to the de-asserted counter output 255p, the corresponding logic high is not entered into the corresponding registers 259A ... 259K.

Consequently, any memory failures occurring at clock cycle I, i.e., corresponding to the $n^{th}$ memory failure, may be reliably stored and locked in the associated compare registers 251, while all other compare registers which do not contain a memory failure at this point in time may be marked so as to be ignored upon reading out the registers 251.

Furthermore, as illustrated, the data shift logic 257 may comprise local shift logics 257A ... 257K, which may enable to shift out the compare register contents at any desired stage and which may also ensure that the serial data stream corresponds to the desired bitmap, such as the vector 239 (FIG. 2a). For this purpose, each of the local shift logics 257A ... 257K may comprise an OR gate 257N, which may receive at one input the output of the local register 259A ... 259K, which as previously explained may indicate whether or not the associated local compare register 251 has been locked at the desired point in time, i.e., at the clock cycle I. Furthermore, another one of the inputs of the OR gate 257N may be connected to a shift mask enable logic 257M, which may be configured to disable a corresponding shift mask after a number of clock cycles that correspond to the number of bits of the local compare registers 251. That is, the output of the OR gate 257N may be connected to one of the inputs of an AND gate 257L which may receive at another input thereof the contents of the compare registers 251, which is serially shifted out from the registers 251. Consequently, the AND gate 257L may act as a shift mask since the contents of the local registers 251 may be provided at the output 257O without modification, if the output of the OR gate 257N is asserted, which requires the associated register 251 to be indicated as being a locked register, as indicated by the output of the register 259A ... 259K, as previously explained, and which also requires an asserted signal from the shift enable logic 257M. Consequently, if one of the local registers 251 may include a logic 1 bit, while the associated output register 259A ... 259K may be in a low state, a shift mask may result in an inversion of a corresponding logic high bit due to the AND gate 257L, thereby "ignoring" any failure bits since these bits may have been produced after the clock cycle I, as explained above. After shifting out the contents of the local registers 251, the shift mask logic 257M may assert the output signal so that the remaining shift operations may not modify the contents of the corresponding local register so that the desired map that corresponds to the memory status at the clock cycle I may be available for further processing.

As a result, the present disclosure provides semiconductor devices and techniques for operating the same in which a memory self-test may be performed at high clock frequencies for memory portions of increased width without being restricted to any bandwidth limitations of interfaces for providing a bitmap. For this purpose, the bitmap may be stored and read out at any appropriate time, for instance after completing the entire test algorithm, thereby enhancing the coverage for speed dependant memory failures without sacrificing valuable information for a further detailed failure analysis.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a memory portion; and
   a memory built-in self-test (MBIST) circuitry connected to said memory portion, said MBIST circuitry configured to perform a memory self-test by reading out said memory portion and comparing read results with a reference data to provide compare results to identify a plurality of memory failures, said MBIST circuitry comprising a failure capturing logic configured to capture and store a failure bitmap associated with a predetermined failure of said plurality of memory failures, wherein said failure capturing logic comprises a plurality of compare registers, each of which is connected to receive an associated subset of said compare results and is configured to be individually locked upon occurrence of at least one compare result of said subset of compare results that indicates a failure.

2. The semiconductor device of claim 1, wherein said failure capturing logic further comprises a global failure indication stage connected to said plurality of compare registers and configured to indicate occurrence of said predetermined failure.

3. The semiconductor device of claim 2, wherein said failure capturing logic further comprises a global lock logic connected to said global failure indication stage and configured to lock each of said plurality of compare registers when said global failure indication stage indicates the occurrence of said predetermined failure.

4. The semiconductor device of claim 2, wherein said global failure indication stage comprises an adjustable failure counter configured to count a number of global failures up to said predetermined failure.

5. The semiconductor device of claim 1, wherein said MBIST circuitry further comprises a data shift stage connected to said plurality of compare registers and configured to serially retrieve contents of said plurality of compare registers so as to obtain a serial data stream representing a bitmap corresponding to said predetermined failure.

6. The semiconductor device of claim 1, wherein a total bit width of said read results of said memory portion is approximately 100 or higher.

7. The semiconductor device of claim 6, wherein a clock frequency for obtaining said read results is adjusted to approximately 1 Giga Hertz (GHz) or higher.

8. A semiconductor device, comprising:
   a memory portion; and
   a memory built-in self-test (MBIST) circuitry connected to said memory portion, said MBIST circuitry configured to perform a memory self-test by reading out said memory portion and comparing read results with a reference data to provide compare results to identify a plurality of memory failures, said MBIST circuitry comprising a failure capturing logic configured to capture and store a failure bitmap associated with a predetermined failure of said plurality of memory failures, wherein said failure capturing logic comprises a plurality of compare registers, each of which is connected to receive an associated subset of said compare results and is configured to be individually locked upon occurrence of at least one compare result of said subset of compare results that indicates a failure, wherein said failure capturing logic further comprises a global failure indication stage connected to said plurality of compare registers and configured to indicate occurrence of said predetermined failure, wherein said failure capturing logic further comprises a global lock logic connected to said global failure indication stage and configured to lock each of said plurality of compare registers when said global failure indication stage indicates the occurrence of said predetermined failure, and wherein said failure capturing logic is further configured to indicate one or more of said compare registers that is not individually locked when globally locking each of said plurality of compare registers.

9. A semiconductor device, comprising:
   a memory portion; and
   a memory built-in self-test (MBIST) circuitry connected to said memory portion, said MBIST circuitry configured to perform a memory self-test by reading out said memory portion and comparing read results with a reference data to provide compare results to identify a plurality of memory failures, said MBIST circuitry comprising a failure capturing logic configured to capture and store a failure bitmap associated with a predetermined failure of said plurality of memory failures, wherein said failure capturing logic comprises a plurality of compare registers, each of which is connected to receive an associated subset of said compare results and is configured to be individually locked upon occurrence of at least one compare result of said subset of compare results that indicates a failure, wherein said MBIST circuitry further comprises a data shift stage connected to said plurality of compare registers and configured to serially retrieve contents of said plurality of compare registers so as to obtain a serial data stream representing a bitmap corresponding to said predetermined failure, and wherein said data shift stage is further configured to gate said serial data so as to maintain the contents of said individually locked compare registers and to modify the contents of the remaining compare registers so as to delete any indication of a failure.

10. A semiconductor device, comprising:
    a memory portion; and
    a memory built-in self-test (MBIST) circuitry connected to said memory portion, said MBIST circuitry configured to perform a memory self-test by reading out said memory portion and comparing read results with a reference data to provide compare results to identify a plurality of memory failures, said MBIST circuitry comprising a failure capturing logic configured to capture and store a failure bitmap associated with a predetermined failure of said plurality of memory failures, wherein said failure capturing logic comprises a plurality of compare registers, each of which is connected to receive an associated subset of said compare results and is configured to be individually locked upon occurrence of at least one compare result of said subset of compare results that indicates a failure, wherein said failure capturing logic further comprises a global failure indication stage connected to said plurality of compare registers and configured to indicate occurrence of said predetermined failure, wherein said global failure indication stage comprises an adjustable failure counter configured to count a number of global failures up to said predetermined failure, and wherein said adjustable failure counter is further configured to provide a pre-lock signal to enable a local lock mechanism for each of said plurality of compare registers.

11. A method of performing a memory self-test of a memory portion of a semiconductor device, the method comprising:
selecting a predefined memory failure of a sequence of memory failures occurring when performing a specified self-test algorithm;
performing said specified self-test algorithm by operating a memory built-in self-test (MBIST) circuitry of said semiconductor device so as to perform a plurality of read operations to obtain an associated read result bit vector from said memory portion and compare each of said plurality of read result bit vectors with a corresponding reference bit vector to obtain a compare result bit vector for each of said read operations; and
storing a compare result bit vector associated with said predefined memory failure in said MBIST circuitry of said semiconductor device, wherein storing said compare result bit vector comprises storing a plurality of subsets of bits of said compare result bit vector in a corresponding set of compare result registers and individually locking respective compare result registers that include at least one bit indicating a memory failure.

12. The method of claim 11, wherein storing said compare result bit vector comprises individually locking said respective compare result registers at a first clock cycle and globally locking said set of compare result registers at a second clock cycle subsequent to said first clock cycle.

13. The method of claim 12, further comprising ignoring a failure indicating bit entered into any of said set of compare result registers at said second clock cycle.

14. The method of claim 13, wherein ignoring said failure indicating bit comprises serially retrieving contents of said set of compare result registers and using a shift mask for any compare result registers that are not individually locked, and wherein said shift mask inverts said failure indicating bit.

15. The method of claim 14, wherein serially retrieving contents of said set of compare result registers comprises using a second shift mask that preserves the contents of said compare result registers that are individually locked.

16. The method of claim 11, wherein said test algorithm is performed at a clock frequency of approximately 1 Giga Hertz (GHz) or higher.

17. The method of claim 16, wherein a width of said read result bit vector is approximately 200 or greater.

18. A method of performing a memory self-test of a memory portion of a semiconductor device, the method comprising:
performing a test algorithm by a device internal test circuitry, said test algorithm providing a plurality of local subsets of failure results at a first clock cycle and a global failure result at a second clock cycle subsequently to said first clock cycle, said global failure result being based on said local subsets of failure results, said plurality of local subsets of failure results including at least one failure result indicating a memory failure;
locking said at least one failure result at said first clock cycle;
globally locking said plurality of local subsets of failure results at said second clock cycle; and
reading out said plurality of local subsets of failure results after completing said test algorithm.

19. The method of claim 18, further comprising ignoring non-locked local failure results.

20. The method of claim 19, wherein said non-locked local failure results are ignored when reading out said plurality of local subsets of failures results.

21. The method of claim 18, further comprising selecting a specified memory failure from a sequence of memory failures detected by performing said test algorithm and globally locking said plurality of local subsets of failure results upon occurrence of said specified memory failure.

22. The method of claim 21, further comprising enabling a local lock mechanism upon occurrence of a memory failure preceding said specified memory failure in said sequence of memory failures.

23. The method of claim 18, wherein a total bit width of said subsets of local failure results is approximately 200 or greater and wherein a clock frequency used for performing said test algorithm is approximately 1 GHz or higher.

* * * * *